(12) United States Patent
Caire et al.

(10) Patent No.: US 12,216,972 B2
(45) Date of Patent: Feb. 4, 2025

(54) METHOD FOR OBTAINING A TEMPORAL MODEL OF A MAGNETIC BEARING, DEVICE FOR MODELLING THE MAGNETIC BEARING AND ASSOCIATED SYSTEMS

(71) Applicant: SKF Magnetic Mechatronics, Saint-Marcel (FR)

(72) Inventors: Francois Caire, Paris (FR); Lakdar Sadi-Haddad, Nogent sur Marne (FR)

(73) Assignee: SKF Magnetic Mechatronics, Saint-Marcel (FR)

( * ) Notice: Subject to any disclaimer, the term of this patent is extended or adjusted under 35 U.S.C. 154(b) by 953 days.

(21) Appl. No.: 17/174,744

(22) Filed: Feb. 12, 2021

(65) Prior Publication Data
US 2021/0279387 A1 Sep. 9, 2021

(51) Int. Cl.
*G06F 30/27* (2020.01)

(52) U.S. Cl.
CPC .................. *G06F 30/27* (2020.01)

(58) Field of Classification Search
CPC .......... G06F 30/27; G06F 30/17; G06F 30/20; F16C 32/0444; G05B 13/04
See application file for complete search history.

(56) References Cited

U.S. PATENT DOCUMENTS

2008/0073993 A1* 3/2008 Sortore .............. F16C 32/0489
310/90.5

FOREIGN PATENT DOCUMENTS

CN 110609472 A 12/2019

OTHER PUBLICATIONS

Medina, JosÃ ©, et al. "A neural network-based closed loop identification of a magnetic bearings system." Turbo Expo: Power for Land, Sea, and Air. vol. 41715. 2004. (Year: 2004).*
Yu, Z. C., Dong Wen, and H. Y. Zhang. "The identification model of magnetic bearing supporting system." 2008 International Conference on Computer Science and Software Engineering. vol. 1. IEEE, 2008. (Year: 2008).*
Medina Hernandez, Jose & Parada, Mónica & Guzmán, Victor & Medina U., Luis & Diaz, Sergio. (2004). A Neural Network-Based Closed Loop Identification of a Magnetic Bearings System. Proceedings of the ASME Turbo Expo 2004. 6.10.1115/GT2004-53103.
Yu, Z.C. & Wen, Dong & Zhang, H.Y.. (2009). The Identification Model of Magnetic Bearing Supporting System. 1. 70-73. 10.1109/CSSE.2008.1324.
Marcsa, Daniel & Kuczmann, Miklos. (2011). Modeling of radial magnetic bearing by finite element method. Pollack Periodica. 6. 13-24.10.1556/Pollack.6.2011.2.2.
G. Schweitzer, E.H. Maslen (eds), Magnetic Bearings, DOI 10.1007/978-3-642-00497-1_12, © Springer-Verlag Berlin Heidelberg 2009.

* cited by examiner

*Primary Examiner* — Nithya J. Moll
(74) *Attorney, Agent, or Firm* — GARCIA-ZAMOR INTELLECTUAL PROPERTY LAW, LLC; Ruy Garcia-Zamor

(57) ABSTRACT

The method for obtaining a temporal model of a magnetic bearing provides the generation of reference data representative of characteristics of the bearing. The method includes the production of the temporal model of the magnetic bearing from the reference data having temporal data.

5 Claims, 3 Drawing Sheets

METHOD FOR OBTAINING A TEMPORAL MODEL OF A MAGNETIC BEARING, DEVICE FOR MODELLING THE MAGNETIC BEARING AND ASSOCIATED SYSTEMS

CROSS-REFERENCE TO RELATED APPLICATIONS

This application claims priority to French Patent Application no. 2002165, filed Mar. 4, 2020, the contents of which is fully incorporated herein by reference.

TECHNICAL FIELD OF THE INVENTION

The present invention relates to the production of a model of magnetic bearings and the implementation of the model. The present invention also relates to a method for obtaining a temporal model of a magnetic bearing.

BACKGROUND OF THE INVENTION

Generally, the production of a digital model of a magnetic bearing entails identifying the magnetic bearing in transient phase with a nonlinear behaviour by injecting input signals representative of the ranges of use of the bearing into power supply terminals of the magnetic bearing or into a detailed digital model of said bearing in order to create a database comprising injected signals and output data resulting from the excitation of the bearing or of the bearing model by the output signals.

The input and associated output data are used to construct the digital model by identification by using, for example, a least squares method.

The identification of the magnetic bearing is performed in the frequency domain.

However, the construction of the digital model implements linear digital solvers requiring the use of sinusoidal signals of low amplitudes to function correctly ("small signals").

In order to take account of the phenomena of nonlinearity governing the behaviour of the magnetic bearing, the nonlinear behaviour of the magnetic bearing is approximated piecewise over a frequency interval used for the frequency identification.

The nonlinearity associated with the magnetic properties is taken into account by first exciting the bearing with static currents, then by adding to the static currents transient sinusoidal currents of low amplitude that make it possible to calculate the linearized frequency response of the magnetic bearing around each operating point.

This operation is also performed for each position of the rotor which also makes it possible to approximately take account of the nonlinearity of the system with regard to the position of the rotor.

However, the use of small signals does not make it possible to take account of all the phenomena of nonlinearity governing the magnetic bearing.

Mitigating all or part of these drawbacks is therefore proposed.

SUMMARY OF THE INVENTION

In light of the above, the invention proposes a method for obtaining a temporal model of a magnetic bearing comprising the generation of reference data representative of characteristics of the bearing.

The method comprises the production of the temporal model of the magnetic bearing from the reference data comprising temporal data.

According to one feature, the reference data comprise learning data and validation data, the learning data comprising at least one input reference data set and at least one output reference data set, and the validation data comprising a first validation data set comprising a first input validation data set and a first output validation data set, the generation of learning data comprising:
a) the generation of the first transient temporal data set of wave forms and of random amplitudes,
b) the determination of the input reference data set from the first transient temporal data set of wave forms and of random amplitudes,
c) the injection of the input reference data set into a nonlinear model of the magnetic bearing or into the magnetic bearing,
d) the collection of the first output reference data set, the output reference data resulting from the excitation of the nonlinear model of the magnetic bearing or of the magnetic bearing by the input reference data set, and
e) the saving of the first input reference data set and of the associated output reference data set, and
the generation of the first validation data set comprising:
f) the generation of a second transient temporal data set of wave forms and of random amplitudes different from the first transient temporal data set,
g) the determination of the first input validation data set from the second transient temporal data set of wave forms and of random amplitudes,
h) the injection of the first input validation data set into the nonlinear model of the magnetic bearing or into the magnetic bearing,
i) the collection of the first output validation data set, the first output validation data set resulting from the excitation of the nonlinear model of the magnetic bearing or of the magnetic bearing by the first input validation data set, and
j) the saving of the first input validation data set and of the associated first output validation data set.

According to another feature, the production of the temporal model comprises a learning step comprising the implementation of an automatic learning algorithm with the learning data.

Preferably, the production of the model further comprises a first validation step in which the temporal model generates a second output validation reference data set associated with the first input validation reference data set.

According to yet another feature, if the absolute value of the difference of the contents of the first output validation data set and second output validation data set is greater within a confidence probability, the method comprises the reiteration of the steps a) to e), of the learning step and of the first validation step.

Advantageously, if the absolute value of the difference of the contents of the first output validation data set and second output validation data set is less than or equal within a confidence probability, the validation data comprise a second validation data set comprising a second input validation data set and a third output validation data set, the generation of the second validation data set comprising:
k) the generation of a third transient temporal data set of wave forms and of random amplitudes, the third temporal data set being different from the first and second temporal data sets, l) the determination of the second input validation data set from the third transient temporal data set of wave forms and of random amplitudes, m) the injection of the second input validation data set into the nonlinear model of the magnetic bearing or into the magnetic bearing, n) the collection of the third output validation data set, the second output validation data set resulting from the excitation of the nonlinear model of the magnetic bearing or of the magnetic bearing by the second input validation data set, and o) the saving of the second input validation data set and of the associated third output validation data set, the production of the model further comprising a second validation step in which the temporal model generates a fourth output validation data set associated with the second input validation data set.

Preferably, if the absolute value of the difference of the contents of the third output validation data set and fourth output validation data set is greater within the confidence probability, the method comprises the reiteration of the steps a) to e), of the learning step and of the first and second validation steps.

Advantageously, the automatic learning algorithm comprises a statistical learning algorithm.

Preferably, the automatic learning algorithm comprises a deep learning method implementing at least one neural network.

According to yet another feature, each transient temporal data set of wave forms and of random amplitudes, the input reference data set and each input validation data set each comprise at least one value of an excitation current of the windings of the magnetic bearing, a value of radial displacement or axial displacement of a rotor of the magnetic bearing and a value of a bias current of the windings of the magnetic bearing, and the first output reference data set and each output validation data set comprise at least one value of a voltage at the terminals of the windings, of a magnetic flux generated by the windings and of a resultant force generated by the windings on the rotor of the magnetic bearing.

According to yet another feature, each transient temporal data set of wave forms and of random amplitudes, the input reference data set and each input validation data set each comprise at least one value of an excitation voltage of the windings of the magnetic bearing, a value of radial displacement or axial displacement of a rotor of the magnetic bearing and a value of a bias current of the windings of the magnetic bearing, and the first output reference data set and each output validation data set comprise at least one value of a current in the windings, of a magnetic flux generated by the windings and a resultant force generated by the windings on the rotor of the magnetic bearing.

Also proposed is a magnetic bearing modelling device comprising a processing unit configured to implement a temporal model of the magnetic bearing as defined previously.

Also proposed is an embedded magnetic bearing control system comprising a magnetic bearing modelling device as defined previously.

Also proposed is a magnetic bearing dimensioning system comprising a magnetic bearing modelling device as defined previously.

BRIEF DESCRIPTION OF THE DRAWINGS

Other aims, features and advantages of the invention will become apparent on reading the following description, given purely as a nonlimiting example, and with reference to the attached drawings in which.

DETAILED DESCRIPTION OF THE INVENTION

Figure 1:
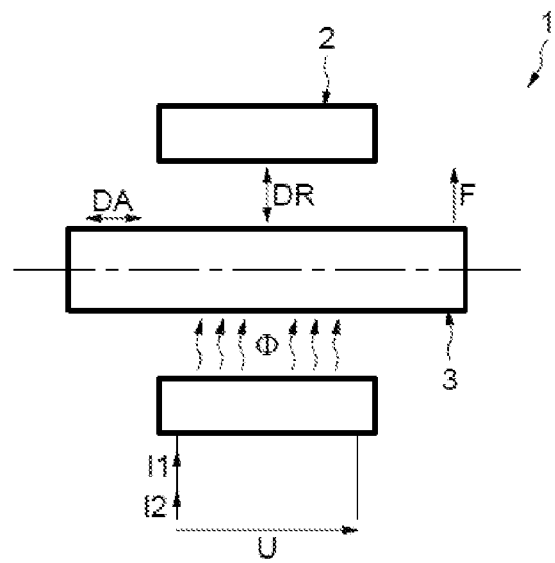
FIG. 1 illustrates an example of a magnetic bearing.

FIG. 1 illustrates an example of a magnetic bearing 1 comprising a stator 2 and a rotor 3 inserted into the stator 2.

The stator 2 comprises a set of windings generating a magnetic flux $\Phi$ to keep the rotor 3 levitated in the stator 2.

The set of windings is powered by a dynamic excitation current $I_1$ and a static bias current $I_2$ so as to generate the magnetic flux $\Phi$.

The voltage at the terminals of the windings is denoted U.

The value of the bias current $I_2$ is chosen such that, when the set of windings is powered by the bias current $I_2$, the rotor 3 is centred in the central circular aperture of the stator 2.

The set of windings exerts a resultant force F on the rotor 3.

Under the effect of the magnetic flux $\Phi$, the rotor 3 is displaced in a radial direction $D_R$ or axial direction $D_A$.

Figure 2:
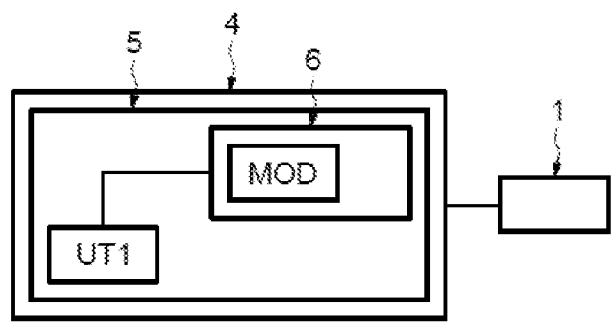
FIG. 2 illustrates an example of an embedded magnetic bearing control system.

FIG. 2 illustrates an example of an embedded magnetic bearing control system 4 driving the magnetic bearing 1.

The embedded system 4 comprises a magnetic bearing modelling device 5 comprising a first processing unit UT1 implementing a temporal model MOD of the magnetic bearing 1.

The temporal model MOD is, for example, stored in a memory 6 of the embedded system 4.

The magnetic bearing modelling device 5 makes it possible to more accurately drive the bearing 1 by modelling its behaviour as a function, for example, of the value of the excitation current $I_1$ injected into the set of windings.

Figure 3:
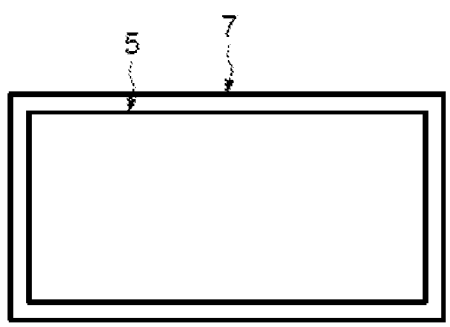
FIG. 3 illustrates an example of a magnetic bearing dimensioning system.

FIG. 3 illustrates an example of a magnetic bearing dimensioning system 7 comprising the magnetic bearing modelling device 5, and making it possible to model the behaviour of the bearing 1 according, for example, to the value of the excitation current $I_1$ injected into the set of windings and according to the geometrical characteristics of the bearing 1.

Figure 4:
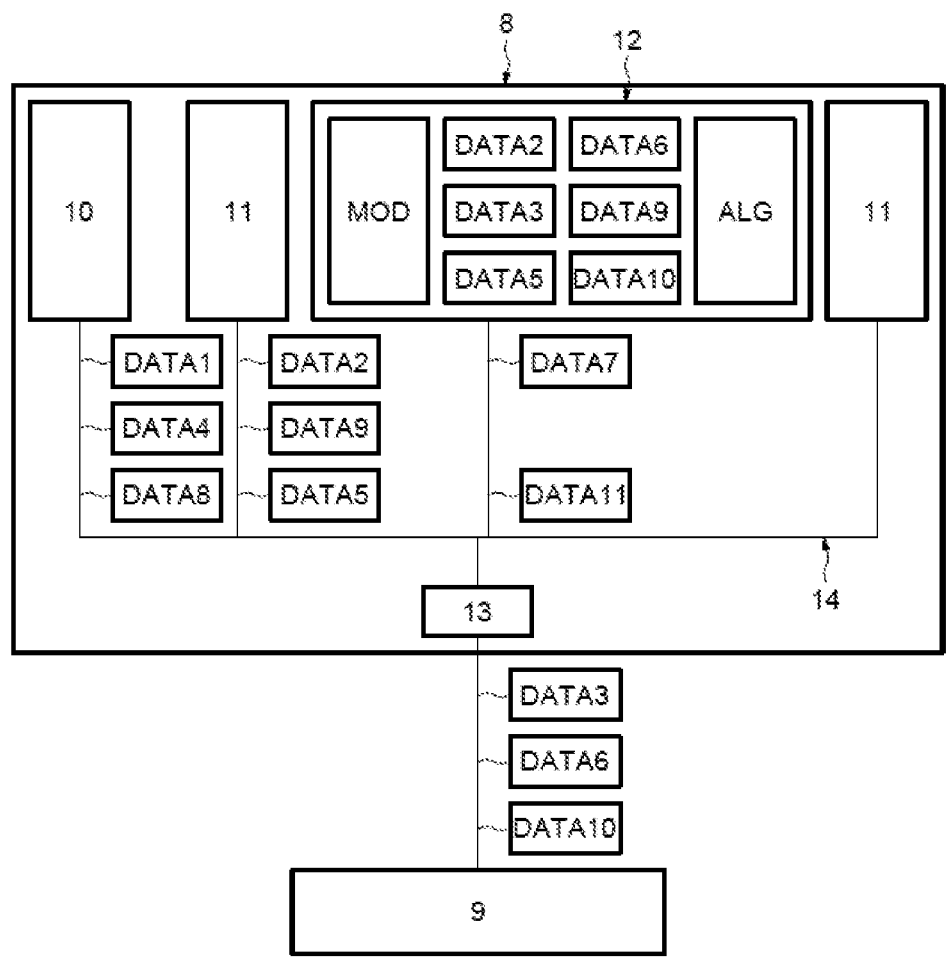
FIG. 4 illustrates an example of a platform for generating a temporal model.

Refer to FIG. 4 which illustrates an example of a platform 8 for generating the temporal model MOD linked to a nonlinear model 9 of the magnetic bearing.

The platform 8 generates the temporal model MOD of the magnetic bearing 1 from reference data representative of characteristics of the bearing comprising temporal data.

The nonlinear model 9 is generated, for example, from a multidisciplinary nonlinear model based on the finite elements theorem, and taking account of mechanical and magnetic couplings to obtain a precise digital model of the bearing 1.

The nonlinear model 9 can comprise a static nonlinear pre-calculation for initializing the magnetic state of the bearing 1.

As a variant, the platform 8 is linked to the magnetic bearing 1.

The platform 8 comprises a module 10 for generating transient temporal data sets DATA1, DATA4 and DATA8 of wave forms and of random amplitudes, a module 11 for determining an input reference data set DATA2 and input validation data sets DATA5, DATA9, a storage memory 12, a second processing unit UT2 and a communication interface 13 that are linked, for example, to a communication bus 14.

The second processing unit UT2 implements the generation module 10, the determination module 11, the communication interface 13, and writes and reads in the memory 12.

The reference data comprise the input reference data set DATA2, a first output reference data set DATA5, a first input validation data set DATA5, a first output validation data set DATA6, a second input validation data set DATA9 and a second output validation data set DATA10.

Each transient temporal data set DATA1, DATA4, DATA8 of wave forms and of random amplitudes, the input reference data set DATA2 and each input validation data set DATA5, DATA9 each comprise at least one value of the excitation current $I_1$, a value of radial displacement $D_R$ or axial displacement $D_A$ of the rotor 3 of the magnetic bearing 1 and a value of the bias current $I_2$.

The first output reference data set DATA3 and each output validation reference data set DATA6, DATA10 comprise at least one value of the voltage U, of the magnetic flux $\Phi$ and of the resultant force F.

As a variant, notably when the platform 8 is linked to the magnetic bearing 1, each transient temporal data set DATA1, DATA4, DATA8 of wave forms and of random amplitudes, the input reference data set DATA2 and each input validation data set DATA5, DATA9 each comprise at least one value of the excitation voltage U of the windings of the magnetic bearing 1, a value of radial displacement $D_R$ or axial displacement $D_A$ of the rotor 3 and a value of the bias current $I_2$, and the first output reference data set DATA3 and each output validation data set DATA6, DATA10 comprise at least one value of the magnetic flux $\Phi$, of the resultant force F and of a current in the windings, for example the excitation current $I_1$.

Hereinbelow, it is considered that each transient temporal data set DATA1, DATA4, DATA8 of wave forms and of random amplitudes, the input reference data set DATA2 and each input validation data set DATA5, DATA9 each comprise at least one value of the excitation current $I_1$, a value of radial displacement $D_R$ or axial displacement $D_A$ of the rotor 3 and a value of the bias current $I_2$, and the first output reference data set DATA3 and each output validation reference data set DATA6, DATA10 comprise at least one value of the voltage U, of the magnetic flux $\Phi$ and of the resultant force F.

Data are exchanged between the platform 8 and the nonlinear model 9 via the interface 13.

The determination module 11 determines the input reference data set DATA2, and the first and second input validation data sets DATA5 and DATA9 respectively from the transient temporal data DATA1, DATA4, DATA8.

The input reference data set DATA2 and the input validation data sets DATA5 and DATA9 can comprise all the data of the sets DATA1, DATA4 and DATA8 or a part of the data of the sets DATA1, DATA4 and DATA8.

The memory 12 stores the temporal model MOD and an automatic learning algorithm ALG.

Figure 5:
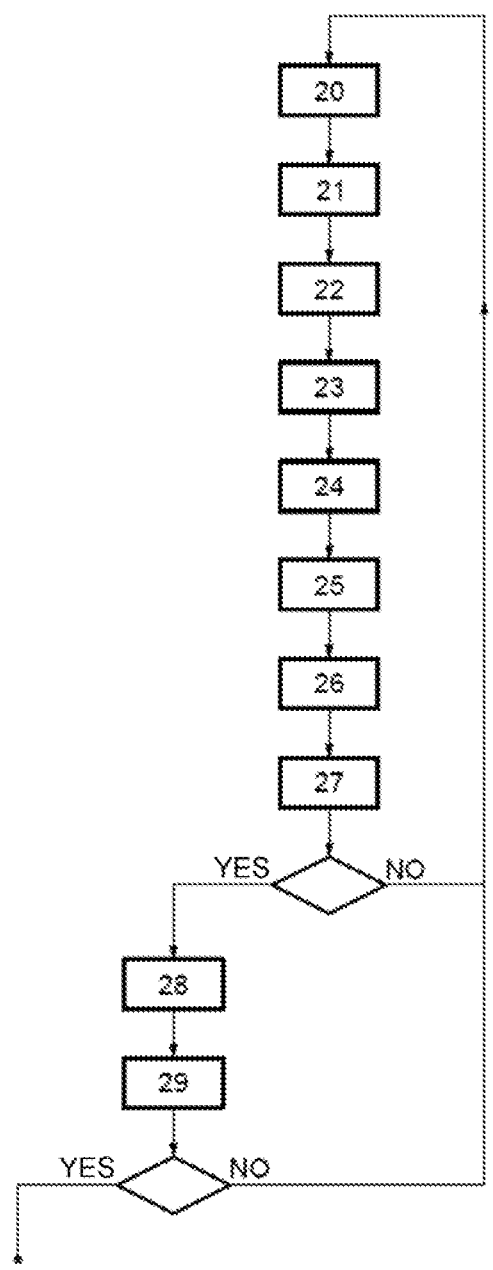
FIG. 5 illustrates an example of implementation of the platform for generating a temporal model.

FIG. 5 illustrates an example of implementation of the platform 8 to obtain the temporal model MOD of the magnetic bearing 1.

The method for obtaining the temporal model MOD of the magnetic bearing 1 comprises learning and validation steps.

During a step 20, the generation module 10 implemented by the second processing unit UT2 generates a first transient temporal data set DATA1 comprising, for example, temporal series.

The first data set DATA1 can comprise several values of the excitation current $I_1$, several values of radial displacement $D_R$ or axial displacement $D_A$ of the rotor 3 and several values of the bias current $I_2$ such that the first data set DATA1 covers all the states and all the dynamics of the bearing 1 in its field of use.

Then, during a step 21, the determination module 11 implemented by the second processing unit UT2 determines the input reference data set DATA2 from the data set DATA1.

The input reference data set DATA2 can comprise only a part of the first data set DATA1 chosen so as to cover all the states and all the dynamics of the bearing 1 in its field of use so as to reduce the size of the input reference data set DATA2 to optimise the reference data generation time.

To determine the part of the first data set DATA1 included in the input reference data set DATA2, optimization methods of "experimental design" type can be implemented.

During a step 22, the input reference data set DATA2 is injected into the nonlinear model 9.

As a variant, the input reference data set DATA2 is injected into the magnetic bearing 1.

Then, in a step 23, the first output reference data set DATA3 is collected.

The first output reference data set DATA3 contains the values of the voltage U, of the magnetic flux $\Phi$ and of the resultant force F determined by the nonlinear model 9 from the data DATA2.

The input reference data set DATA2 and the associated first output reference data set DATA3 are saved in the memory 12.

During a learning step 24, the processing unit 11 implements the automatic learning algorithm with the learning data comprising the input reference data set DATA2 and the output reference data set DATA3 to generate the temporal model MOD.

Then, at the end of the learning phase (step 25), the generation module 10 implemented by the second processing unit UT2 generates the second transient temporal data set DATA4 that is different from the first transient temporal data set DATA1.

During a step 26, the second processing unit UT2 determines the first input validation data set DATA5 from the data set DATA4 in the same way as for determining the input reference data set DATA2 from the data set DATA1 as described in the step 21, determines and stores in the memory 12 the first output validation data set DATA6 comprising the values of the voltage U, of the magnetic flux $\Phi$ and of the resultant force F determined by the nonlinear model 9 from the data DATA5 in the same way as for determining the output reference data set DATA3 from the input reference data set DATA2 as described in the steps 22 and 23.

Obviously, the reference data set and the first validation data set can be generated simultaneously.

Then, in a step 27, the first input validation data set DATA5 is injected as input for the model MOD so that it generates a second output validation data set DATA7 associated with the first input validation data set DATA5.

If the absolute value of the difference of the contents of the first output validation data set DATA6 and the second output validation data set DATA7 is greater within a confidence probability, the method continues with the step 20.

If the absolute value of the difference of the contents of the first output validation data set DATA6 and second output validation data set DATA7 is less than or equal within the confidence probability, the second processing unit UT2 determines a second validation data set comprising a second input validation data set DATA9 and a third output validation data set DATA10 from the third transient temporal data set DATA8 that is different from the first and second transient temporal data sets DATA1 and DATA4 in a way similar to the determination of the first validation data set described in the step 26 (step 28).

Then, in a step 29, the second input validation data set DATA9 is injected as input for the model MOD so that it generates a fourth output validation data set DATA11 associated with the second input validation data set DATA9.

If the absolute value of the difference of the contents of the third output validation data set DATA10 and fourth output validation data set DATA11 is greater within a confidence probability, the method continues with the step 20.

If the absolute value of the difference of the contents of the third output validation data set DATA10 and fourth output validation data set DATA11 is less than or equal within the confidence probability, the accuracy of the temporal model MOD is satisfactory and, for example, allows the implementation thereof in the modelling device 5, the embedded control system 4 or the dimensioning system 7.

Obviously, the steps 28 and 29 are optional, the method for producing the model MOD being able to be completed when the absolute value of the difference of the contents of the first output validation data set DATA6 and second output validation data set DATA7 is less than or equal within the confidence probability.

The confidence probability is for example equal to 5%.

The algorithm ALG can comprise any type of automatic learning algorithm, notably a statistical learning algorithm, for example of kriging type.

As a variant, the automatic learning algorithm comprises a deep learning method implementing at least one neural network, for example a recurrent neural network.

The implementation of the temporal model MOD is less of a consumer in terms of computation power than the implementation of the model 9, allowing the temporal model to be implemented in the embedded system 4 and to be implemented in the dimensioning system 7.

Obviously, the temporal model MOD can be implemented in other systems.

The use of transient temporal data DATA1 makes it possible to cover all the static and dynamic states of the bearing 1 within its range of use by taking account of all of the nonlinearity phenomena. This makes it possible to obtain a temporal model MOD of improved accuracy.

The invention claimed is:

1. A method for obtaining a temporal model of a magnetic bearing comprising:
  providing a magnetic bearing modelling device, the magnetic bearing modelling device having a at least one processing unit,
  providing the magnetic bearing, the first processing unit being configured to receive reference data from the magnetic bearing,
  generating the reference data representative of characteristics of the magnetic bearing created by operation of the magnetic bearing, and
  producing, by the at the least one processing unit, the temporal model of the magnetic bearing from the reference data comprising temporal data, wherein the reference data comprise learning data and validation data, the learning data comprising at least one input reference data set and at least one output reference data set, and the validation data comprising a first validation data set comprising a first input validation data set and a first output validation data set, and
    wherein the method further comprises generation of learning data by the at least one processor comprising:
      a) generating a first transient temporal data set of wave forms and of random amplitudes,
      b) determining the input reference data set from the first transient temporal data set of wave forms and of random amplitudes,
      c) injecting the input reference data set into a nonlinear model of the magnetic bearing or in the magnetic bearing,
      d) collecting the output reference data set, the output reference data resulting from exciting the nonlinear model of the magnetic bearing or of the magnetic bearing by the input reference data set, and
      e) saving the input reference data set and of the associated output reference data set, and
    generating the first validation data set comprising:
      f) generating a second transient temporal data set of wave forms and of random amplitudes different from the first transient temporal data set,
      g) determining the first input validation data set from the second transient temporal data set of wave forms and of random amplitudes,
      h) injecting the first input validation data set into the nonlinear model of the magnetic bearing or into the magnetic bearing,
      i) collecting the first output validation data set, the first output validation data set resulting from the excitation of the nonlinear model of the magnetic bearing or of the magnetic bearing by the first input validation data set, and
      j) saving the first input validation data set and of the associated first output validation data set.

2. The method according to claim 1, wherein each transient temporal data set of wave forms and of random amplitudes, the input reference data set and each input validation data set each comprise at least one value of an excitation current of a plurality of windings of the magnetic bearing, a value of radial displacement or axial displacement of a rotor of the magnetic bearing and a value of a bias current of the windings of the magnetic bearing, and the first output reference data set and each output validation data set comprise at least one value of a voltage at a plurality of terminals of the windings, of a magnetic flux generated by the windings and a resultant force generated by the windings on the rotor of the magnetic bearing.

3. The method according to claim 1, wherein, each transient temporal data set of wave forms and of random amplitudes, the input reference data set and each input validation data set each comprise at least one value of an excitation voltage of windings of the magnetic bearing, a value of radial displacement or axial displacement of a rotor of the magnetic bearing and a value of a bias current of the windings of the magnetic bearing, and the first output reference data set and each output validation data set comprise at least one value of a current in the windings, of a magnetic flux generated by the windings and of a resultant force generated by the windings on the rotor of the magnetic bearing.

4. A method for obtaining a temporal model of a magnetic bearing comprising:

providing a magnetic bearing modelling device, the magnetic bearing modelling device having a at least one processing unit, providing the magnetic bearing, the first processing unit being configured to receive reference data from the magnetic bearing, generating the reference data representative of characteristics of the magnetic bearing created by operation of the magnetic bearing, and producing, by the at the least one processing unit, the temporal model of the magnetic bearing from the reference data comprising temporal data, wherein the production of the temporal model comprises a learning step comprising implementation of an automatic learning algorithm with the learning data, wherein the production of the temporal model further comprises a first validation step in which the temporal model generates a second output validation data set associated with the first input validation data set, wherein if the absolute value of a difference of the first output validation data set and second output validation data set is less than or equal to a confidence probability, the validation data comprise a second validation data set comprising a second input validation data set and a third output validation data set, generating the second validation data set comprising:

k) generating a third transient temporal data set of wave forms and of random amplitudes, the third temporal data set being different from the first and second temporal data sets, l) determining the second input validation data set from the third transient temporal data set of wave forms and of random amplitudes, m) injecting the second input validation data set into the nonlinear model of the magnetic bearing or into the magnetic bearing, n) collecting the third output validation data set, the second output validation data set resulting from the excitation of the nonlinear model of the magnetic bearing or of the magnetic bearing by the second input validation data set, and o) saving the second input validation data set and of the associated third output validation data set, and producing a model further comprising a second validation step in which the temporal model generates a fourth output validation data set associated with the second input validation data set.

5. The method according to claim 4, wherein, if the absolute value of the difference of the contents of the third output validation data set and fourth output validation data set is greater than the confidence probability, the method comprises the reiteration of the steps a) to e), of the learning step and of the first and second validation steps.

* * * * *